United States Patent
Rottstegge et al.

(10) Patent No.: US 6,770,423 B2
(45) Date of Patent: Aug. 3, 2004

(54) NEGATIVE RESIST PROCESS WITH SIMULTANEOUS DEVELOPMENT AND SILYLATION

(75) Inventors: Jörg Rottstegge, Erlangen (DE); Eberhard Kühn, Hemhofen (DE); Waltraud Herbst, Uttenreuth (DE); Christian Eschbaumer, Schwaig (DE); Christoph Hohle, Bubenreuth (DE); Gertrud Falk, Erlangen (DE); Michael Sebald, Weisendorf (DE)

(73) Assignee: Infineon Technologies AG, Munich (DE)

( * ) Notice: Subject to any disclaimer, the term of this patent is extended or adjusted under 35 U.S.C. 154(b) by 142 days.

(21) Appl. No.: 10/186,660

(22) Filed: Jul. 1, 2002

(65) Prior Publication Data

US 2003/0082488 A1 May 1, 2003

(30) Foreign Application Priority Data

Jun. 29, 2001 (DE) .......................................... 101 31 667

(51) Int. Cl.[7] .............................. G03F 7/00; G03C 1/492

(52) U.S. Cl. ..................................... 430/311; 430/270.1
(58) Field of Search ................................ 430/311, 270.1

(56) References Cited

U.S. PATENT DOCUMENTS

| 4,491,628 A | | 1/1985 | Ito et al. |
| 5,545,509 A | * | 8/1996 | Cameron et al. ........ 430/270.1 |
| 2003/0036023 A1 | * | 2/2003 | Moreau et al. ............. 430/324 |

FOREIGN PATENT DOCUMENTS

| EP | 0 395 917 A2 | 11/1990 |
| WO | WO 01/42660 A1 | 6/2001 |

* cited by examiner

Primary Examiner—Mark F. Huff
Assistant Examiner—K. Sagar
(74) Attorney, Agent, or Firm—Laurence A. Greenberg; Warner H. Stemer; Gregory L. Mayback

(57) ABSTRACT

The invention relates to a process for producing amplified negative resist structures in which, following exposure and contrasting of the resist in a developing step, the resist structure is simultaneously developed and silylated. This substantially simplifies the production of amplified resist structures.

8 Claims, 1 Drawing Sheet

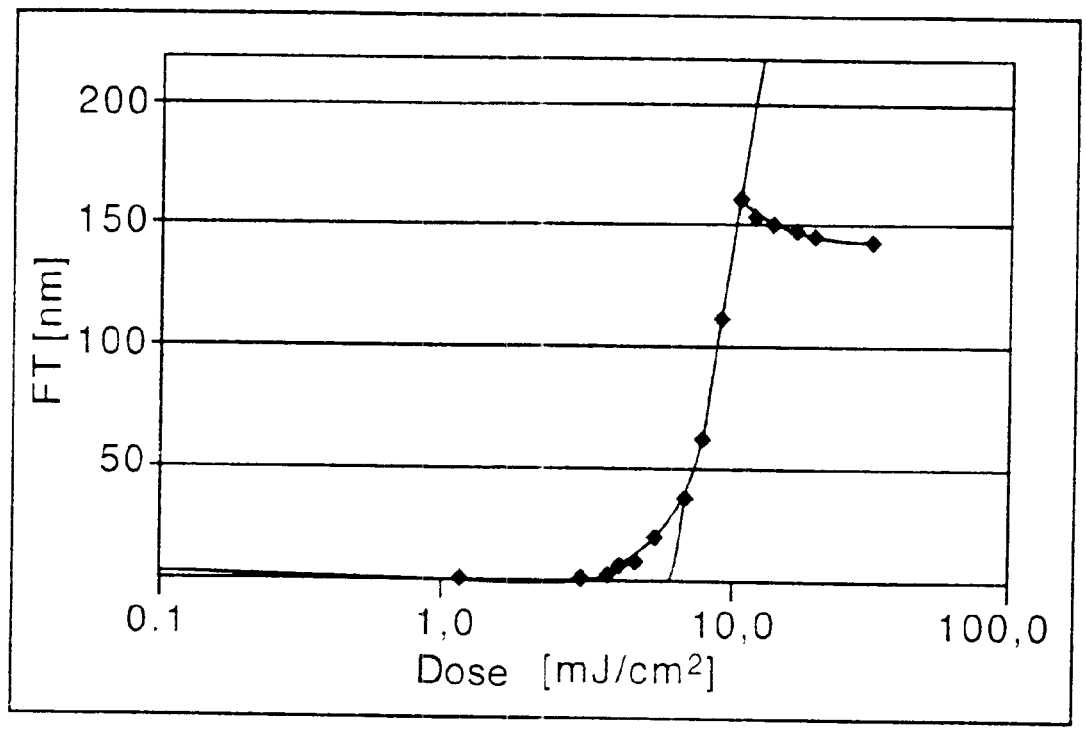

NEGATIVE RESIST PROCESS WITH SIMULTANEOUS DEVELOPMENT AND SILYLATION

BACKGROUND OF THE INVENTION

Field of the Invention

The invention relates to a process for producing amplified negative resist structures.

In the fabrication of microchips, semiconductor substrates are structured (or patterned) using thin layers of photoresists. The chemical nature of the photoresists can be selectively altered by exposing the photoresists using a photomask or by direct irradiation, with an electron beam, for example. Following a developing step, in which either the exposed or the unexposed areas of the photoresist are removed, a structured photoresist is obtained that is used as a mask for etching the semiconductor substrate, for example. In the case of dry etching, the etching operation is usually carried out with a fluorine or an oxygen plasma. In order to selectively etch only the bare areas of the substrate, therefore, the mask-forming resist structure must possess sufficient resistance to the plasma that is used. When using an etching plasma containing oxygen, the photoresist therefore usually includes groups containing silicon. In the course of the etching operation, these groups are converted into silicon dioxide, which forms an etch-stable protective layer on the photoresist. The silicon atoms either may already be present in the photoresist polymer or may be introduced into the polymer subsequently, following the development of the resist structure, in a consolidation reaction. For this purpose, reactive groups are provided, such as acid anhydride groups, carboxyl groups or acidic phenolic hydroxyl groups, to which the amplifying agent, which carries a corresponding reactive group, an amino group for example, can be chemically attached.

In order to be able to realize low exposure doses and short exposure times when exposing the photoresist, photoresists known as chemically amplified resists (CARs) have been developed. In this case the photoresist includes a photosensitive compound that liberates a catalyst on exposure. In a subsequent amplifying step, the catalyst is able to bring about a chemical reaction that gives rise to a marked change in the chemical nature of the photoresist. With a single quantum of light, which liberates one catalyst molecule, it is therefore possible to bring about a multiplicity of chemical reactions and to achieve a marked differentiation between the exposed and unexposed areas of the photoresist. The catalyst used is usually a strong acid that is liberated by a photoacid generator, an onium compound for example. The polymer contains acid-labile groups, such as tertiary butyl groups, which are eliminated under the action of the acid liberated. The elimination of the acid-labile group is generally accompanied by the liberation of an acidic group: for example, a carboxyl group or an acidic hydroxyl group. This brings about a marked change in the polarity of the polymer, i.e., in its solubility in polar solvents. The polymer originally used in the photoresist, carrying acid-labile groups, is soluble in apolar solvents or solvent mixtures having a low polarity, such as alkanes, but also in alcohols, ketones or esters, whereas the polymer following elimination of the acid-labile groups is soluble in polar solvents, generally water or basic, aqueous-organic developer solutions.

In connection with the production of resist structures, a range of processes have already been developed, which can be divided into two groups.

In the case of positive photoresists, the exposed areas of the photoresist are detached in the developing step and in the structured photoresist, for example, form trenches, whereas the unexposed areas remain on the substrate and form the lines of the photoresist structure.

For producing positive photoresist structures, the procedure described above can be followed. As a result of the exposure, a chemical reaction is initiated within the photoresist, by means of which the photoresist polymer becomes soluble in alkaline developer solutions: for example, a 2.38% strength solution of tetramethylammonium hydroxide in water. On development, then a corresponding positively structured photoresist is obtained.

In the case of negative resists, in contrast to the positive-working resists, the exposed portion of the resist remains on the substrate, whereas the unexposed portion is removed by the developer solution. When working with chemically amplified negative resists, exposure initially likewise liberates a catalyst, usually a strong acid. The catalyst brings about, for instance, a crosslinking reaction in the photoresist, as a result of which the solubility of the polymer in the developer medium is reduced. As a result of the crosslinking, the exposed area becomes insoluble, whereas the unexposed area can be removed in appropriate developers. Developers used are generally aqueous solutions, so that the polymer usually has polar groups in the unexposed state.

For a modification of the developing step, a positive photoresist can also be used to produce a negative resist structure. A process of this kind is described, for example, in U.S. Pat. No. 4,491,628. There, a layer of a positive photoresist that is applied to a substrate is first of all exposed as described above, and an acid is liberated from a photoacid generator. In the subsequent amplifying step, the acid-labile groups in the exposed areas are eliminated by heating, so that the polymer is then in a polar form. In contradistinction to the positive developing process described above, exposure is not carried out with a polar aqueous developer, but instead with an apolar solvent. As a result, only the unexposed areas of the substrate, in which the polymer has retained its original apolar form, are detached. Since the polar fractions of the resist, in which the polar groups—carboxylic acid groups, for example—have been produced by the exposure, are insoluble in apolar solvents, they remain as lines on the substrate.

Another negative photoresist includes not only a photobase, but also a thermoacid. A resist of this kind is described, for example, in Published PCT Patent Application PCT/DE00/04237. On exposure of the photoresist, a base is liberated in the exposed areas. In a subsequent amplifying step, an acid is liberated from the thermoacid generator by heating. In the exposed areas the acid is neutralized by the base being liberated beforehand and is therefore no longer available as a catalyst. In the unexposed areas, the acid catalyzes the elimination of the acid-labile groups from the polymer. Accordingly, in the unexposed areas, the polymer is converted from its apolar form into a polar form. In the subsequent developer step, therefore, the unexposed areas can be selectively detached from the substrate using an aqueous-alkaline developer, while the exposed areas remain as lines on the substrate.

As already mentioned, for etching the substrate, the resist structure must possess sufficient etch resistance. For this purpose, for instance, the lines of the resist structure must have a sufficient layer thickness. This is a particular problem in the case of resists for the 157 nm and the 13 nm technology, since at these wavelengths the photoresists known to date exhibit high absorption. Accordingly, only very thin polymer films can be used, in order to ensure that the radiation used for exposure is able to penetrate even into the deep areas of the resist in sufficient intensity, in order to be able to liberate sufficient quantities of catalyst. If insufficient quantities of catalyst are liberated in the lower layers of the photoresist, elimination of the acid-labile groups is incomplete, or in a worst case scenario, does not take place at all. A consequence of this is that following development residues of the polymer remain in the trenches, forming what are known as resist feet. Because of its low layer thickness, the resistance of the structured photoresist to an etching plasma is insufficient, which is why its etch resistance must be increased. For this purpose, following development, the structured resist is chemically amplified. Where the resist structures have a sufficient layer thickness, it is also possible, in addition to an increase in layer thickness, to bring about a narrowing of the trenches, perpendicularly to the substrate surface, by laterally growing layers on the sidewalls of the trenches of the structured resist. As a result it is possible to achieve an improvement in resolution: that is, for example, the reproduction of narrower conductor tracks. A process of this kind is described, for example, in Issued European Patent EP 0 395 917 B1. In order to amplify the resist structure, the amplifying agent in solution in a suitable solvent or else in the gas phase, can be applied to the structured resist. The incorporation of silicon-containing amplifying agents into the polymer is generally referred to as silylation.

The existing processes for producing amplified resist structures involve a multiplicity of worksteps and are therefore very complicated to carry out. Every workstep also increases the error rate in the fabrication of microchips, meaning that a correspondingly high rejection rate must be tolerated. This is also a problem on account of the fact that nondestructive testing is not possible at every step in microchip fabrication. Generally, error testing of this kind is possible only after several production steps, since it is only then that the electrical connections necessary for testing are present in the microchip. In some circumstances, therefore, several weeks may pass between the production step and error testing. Accordingly, an extremely low error rate is required for each production step.

The chemical consolidation requires corresponding reactive "anchor" groups in the polymer, to which the amplifying agent can be attached. Preparation of these polymers necessitates processes that are likewise complex, since, for example, they must be carried out in the absence of moisture in order to prevent premature hydrolysis of the reactive anchor groups.

SUMMARY OF THE INVENTION

It is accordingly an object of the invention to provide a process for producing amplified negative resist structures that is easy to carry out and that has a lower error rate as compared with the existing processes.

With the foregoing and other objects in view there is provided, in accordance with the invention, a process for producing amplified negative resist structures. The process includes steps of: providing a chemically amplified resist including: a polymer including acid-labile groups, which on exposure to an acid, are eliminated and liberate anchor groups bringing about a change in a polarity of the polymer, a photoacid generator, and a solvent; applying the chemically amplified resist to a substrate; removing the solvent to provide a photosensitive resist film; sectionally exposing the resist film to liberate an acid from the photoacid generator in exposed sections of the resist film; and contrasting the exposed resist film such that the acid-labile groups of the polymer are eliminated by the acid, which has been liberated, and the anchor groups are liberated in the exposed sections of the resist film. The process also includes developing the exposed resist film, which has been contrasted, with a developer including: a solvent in which the polymer, when in a state including the acid-labile groups, is soluble and in which the polymer, when in a state after the anchor groups have been liberated, is substantially insoluble or swellable, and a silicon-containing amplifying agent including at least one reactive group that is able to coordinate to the anchor groups of the polymer. In addition, the process includes removing excess developer.

In accordance with an added feature of the invention, the developer includes a swelling promoter that swells the polymer when in the state after the anchor groups have been liberated.

In accordance with an additional feature of the invention, the solvent of the developer is apolar.

In accordance with another feature of the invention, the solvent of the developer has a low polarity.

In accordance with a further feature of the invention, the polymer includes further reactive anchor groups that are able to form a bond with the reactive group of the amplifying agent.

In accordance with a further added feature of the invention, the amplifying agent includes at least two reactive groups.

In accordance with yet an added feature of the invention, the reactive group of the amplifying agent is a basic group.

In accordance with yet an additional feature of the invention, the amplifying agent is an aminosiloxane.

In the process, the resist structure is developed and is amplified with a silicon-containing amplifying agent in one conjoint step. As a result, in comparison to the existing processes, the development of the resist structure with a suitable developer medium in a separate workstep is omitted, together with the subsequent rinsing and drying step. As a result, there is a corresponding reduction in the error rate associated with the production of amplified structured resists. The process of the invention is easier to carry out than the processes used to date and therefore results in a reduction in costs. The process can be carried out using the photoresists customary for producing positive resist structures and the customary silicon-containing amplifying agents. Implementation of the process of the invention into existing production lines requires no special effort apart from a change in the solvent used for developing and amplifying.

Polymers which can be used for the photoresist are those which following exposure and contrasting, liberate a reactive group which is able to enter into reaction with the amplifying agent. The reaction may lead to the formation of a covalent bond between an anchor group and the amplifying agent. However, the amplifying agent may also be attached to the anchor group of the polymer by noncovalent bonds, e.g., ionic interactions or dipole-dipole interactions. Suitable therefore, for example, are the polymers customary for positive photoresists. The polymers must have adequate film-forming properties to be able to produce a uniform film of the photoresist on the substrate. Any polymer can be used which possesses, in the polymer chain or pendantly, acid-labile groups of low alkali solubility which generate reactive groups, such as acidic groups, on the polymer as a result of the catalytic effect of acid, and where appropriate, a simultaneous temperature treatment (contrasting). Examples of suitable acid-labile groups include tert-alkyl ester, tert-butoxycarbonyloxy, tetrahydrofuranyl, tetrahydro-pyranyl, tert-butyl ether, lactone or acetal groups. Tert-Butyl ester groups are particularly preferred. The polymer preferably contains groups which bring about increased transparency of the polymer (and hence of the resist layer) to light of a very short wavelength, 157 nm for example. Such groups are 1,1,1,3,3,3-hexafluoro-2-hydroxy-isopropyl groups, for instance, in which the hydroxyl function is substituted by a tert-butyl ether, tert-butoxy-carbonyloxy, tetrahydrofuranyl, tetrahydropyranyl or acetal radical or by another acid-eliminable radical.

The film-forming polymer may be obtained by polymerization or copolymerization of corresponding monomers. Examples of monomers include acrylates, methacrylates, maleic monoesters and diesters, itaconic monoesters and diesters, norbornenecarboxylic esters or else norbornenedicarboxylic monoesters and diesters. Corresponding repeating units of the polymer are depicted below. Y stands for an acid-labile group, one of the abovementioned groups for example, and $R^1$ stands for a non-acid-labile radical, an alkyl group having from 1 to 10 carbon atoms, for example.

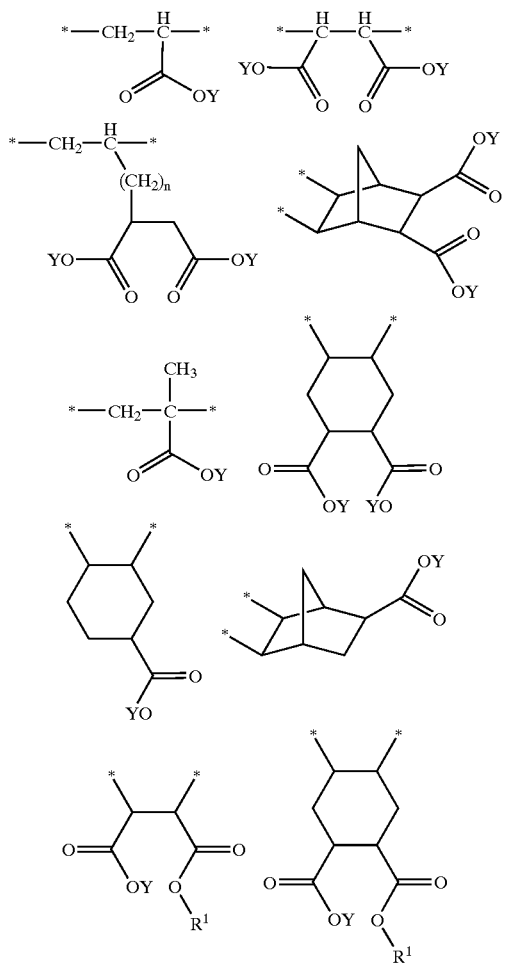

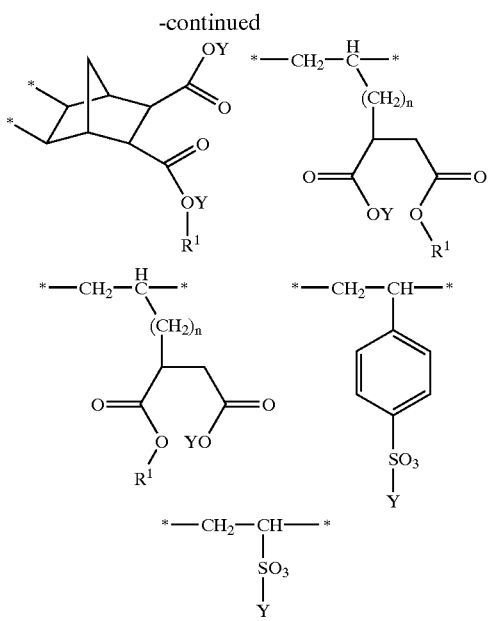

These monomers can be copolymerized with further monomers which may also already include silicon-containing groups. One suitable silicon-containing monomer, for example, is allyltrimethylsilane. Other suitable copolymerisable monomers are, for example, styrene or methyl methacrylate. Besides the monomers mentioned, it is also possible to use other monomers customary for the preparation of polymers for photoresists.

As photoacid generators it is likewise possible to use the photoacid generators which are customary for photoresists. Preference is given to using onium compounds, as described, for example, in European Patent Application EP 0 955 562 A1.

Resist solvents which can be used include, for example, methoxypropyl acetate, cyclopentanone, cyclohexanone, γ-butyrolactone, ethyl lactate, diethylene glycol dimethyl ether, or a mixture of at least two of these compounds. In general, however, all common solvents, or mixtures thereof, which are capable of taking up the resist components in a clear, homogeneous, and storage-stable solution can be used, which ensure good layer quality when the substrate is coated.

The photoresist is applied to the substrate by the conventional techniques, such as by spincoating, spray application or dipping methods. The solvent is subsequently removed by conventional methods. For this purpose, generally speaking, the substrate with the resist film is heated.

Thereafter, the resist film is exposed, for which purpose again the conventional methods can be employed. Exposure may take place, for example, by means of a photomask or else by direct exposure with focused electrons or ions. The exposing radiation preferably has a wavelength in the range from 10 to 400 nm. In the exposed areas, the photoacid generator liberates an acid, so that a latent image of the desired structure is generated. Exposure of the resist film is followed by a contrasting step in which the latent image is intensified and is impressed into the polymer of the photoresist, so that the photoresist now has a chemical profile. For this purpose, the substrate with the exposed resist film is heated, generally at temperatures from 80 to 200° C. Under the catalytic effect of the acid, the acid-labile groups on the polymer are eliminated and the anchor groups for the attachment of the amplifying agent are liberated. The anchor groups generally have a high polarity, which is why the polymer now likewise has a high polarity and hence a high solubility in polar solvents or a low solubility in apolar solvents. The process of the invention then utilizes the difference in polarity of the polymer in the exposed and unexposed state, in other words its different solubility in the solvent. Where the polymer contains acid-labile ester groups in the unexposed state, then following exposure and contrasting it contains carboxyl groups. The polymer in the unexposed state, therefore, is comparatively apolar and is soluble in apolar or weakly polar solvents, whereas the polymer following exposure and contrasting has a polar nature and is therefore insoluble in apolar or weakly polar solvents. This difference in solubility is then utilized in the developing step. The solvent is selected so that the polymer containing acid-labile groups is soluble and the polymer in which the anchor groups have been liberated is insoluble or swellable. As a result, in the developing step only the unexposed areas of the substrate are detached and in the unexposed areas, structures are formed in which the substrate is bare. The developer further contains a silicon-containing amplifying agent which has at least one reactive group which is able to coordinate to the anchor groups of the polymer. The amplifying agent may therefore be attached to the exposed areas of the photoresist as early as during the developing step, and may act there to increase the layer thickness and etch resistance of the resist. Coordination of the amplifying agent to the polymer preferably takes place by the formation of a chemical bond between the anchor groups of the polymer and the reactive group of the amplifying agent, accompanied, for example, by the formation of an amide bond. Also possible, however, is the formation of a salt or the coordination of polar groups. The amide bond may also be formed such that first of all, in the developing/amplifying step, an ammonium salt is formed by the anchor group and the amplifying agent, and in a subsequent production step, e.g., during drying of the developed and amplified resist, heating is carried out, such that an amide bond between the polymer and the amplifying agent is formed with the elimination of water.

Solvents used for the developer include apolar or weakly polar solvents. All conventional aliphatic, cycloaliphatic, and aromatic solvents are suitable, such as alcohols, aldehydes, ketones, lactones or esters of low polarity, and also mixtures of the solvents. The solvents must take up the components of the developer in the form of an emulsion, or preferably in a clear, homogeneous, and storage-stable solution and must not react with the amplifying agent or with the anchor groups present on the polymer.

Following the development and amplification of the resist structure, excess developer is removed with an appropriate solvent and the resist structure is dried.

In order to ensure a reaction rate that is sufficient for practical application when attaching the amplifying agent to the polymer and to ensure a sufficient increase in layer thickness, the composition of the developer should be such that the resist is swollen by the developer in the exposed areas. This allows the-amplifying agent to penetrate relatively deep layers of the resist structure, and so permits better amplification. Swelling of the resist in the exposed areas may be achieved simply by an appropriate choice of solvents. If, however, the exposed and contrasted resist exhibits only a very low solubility in the developer solvent, or if it is insoluble in the solvent, it is possible to admix to the developer, a swelling promoter that swells the polymer in which the anchor groups are liberated. Suitable swelling promoters include low molecular mass polar compounds, such as water, for instance, low molecular mass alcohols, e.g., methanol and ethanol, and low molecular mass aldehydes and ketones, such as acetone, for instance.

As the silicon-containing amplifying agent it is possible to use any customary amplifying agents which include silicon-containing groups, provided these agents are of sufficient reactivity toward the anchor groups of the polymer and do not react with the solvent of the developer. The silicon-containing amplifying agent should be able to diffuse into the polymer at a rate that is sufficient for reaction in an industrial production process. The amplifying agent should therefore preferably have a molecular weight in the range from 100 to 2,000 g/mol.

Since the anchor group of the polymer is usually an acidic group, such as a carboxyl group or an acidic hydroxyl group, such as phenolic hydroxyl group, the reactive group of the amplifying agent is preferably a basic group. Particularly suitable in this context are amino groups, which are able to react, for example, with a carboxyl group to form an amide bond. The amplifying agent is preferably a silicon compound with basic functionalization, especially an aminosiloxane. Those which have proven particularly appropriate include catenated dimethylsiloxanes containing terminal aminopropyl units and from 2 to 50, but preferably from 2 to 12, silicon atoms per molecule. A catenated dimethylsiloxane of this kind is depicted below with its general structural formula.

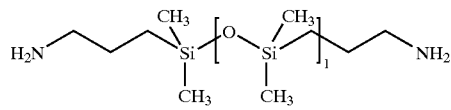

l = 1–49

Instead of the methyl groups it is also possible for other alkyl groups to be provided in the aminosiloxane, examples being ethyl groups or propyl groups. Further examples of amplifying agents containing amino-functional groups can be represented by the following general structural formula.

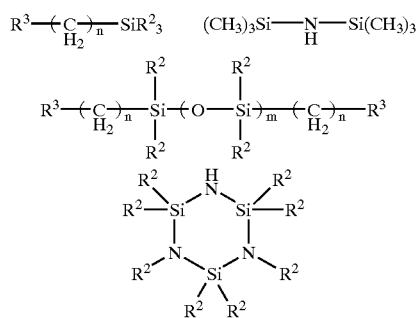

where $R^2$=H, alkyl, aryl, cycloalkyl and $R^3$=

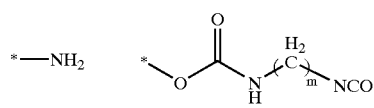

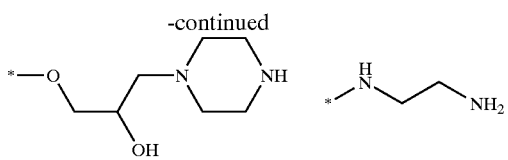

A further very suitable reactive group in the amplifying agent is the isocyanate group. It is able to react, in particular, with hydroxyl groups that are present in the polymer.

The inventive process is preferably implemented in such a way that the solvent of the developer is apolar or has a low polarity. The polarity of the solvent relates in this case to its solvency for apolar or polar compounds, respectively.

In the inventive process, the polymer need not per se contain any more groups which serve as reaction anchors for the consolidation of the resist structure. Such anchor groups are formed in the contrasting step on the acid-catalyzed elimination of the acid-labile groups following exposure, in the form, for instance, of acid groups or (acidic) alcoholic groups. This has the advantage that the polymers are much easier to process, since they contain no groups that are sensitive to hydrolysis.

Preferably, however, in addition to the anchor groups protected by an acid-labile group, the polymers include further reactive anchor groups that are able to react with the reactive group of the amplifying agent to form a covalent bond. In this case, in the course of the amplifying step, there is an irreversible fixing of the amplifying agent on the polymer. Suitable for this purpose in particular are acid anhydride groups provided in the polymer, which are introduced into the polymer by copolymerization of unsaturated carboxylic anhydrides. Examples of suitable monomers are maleic anhydride, itaconic anhydride or methacrylic anhydride. The anchor groups liberated by the elimination of the acid-labile groups have the further function, in the case of this variant of the process, of raising the polarity of the polymer and so lowering the solubility of the polymer in the solvent of the amplifying agent.

These reactive anchor groups may also be utilized for further modification of the photoresist. By way of example, the insolubility of the exposed areas in the developer can be increased further if further crosslinking of the polymer is brought about. This can be achieved, for example, by the amplifying agent containing at least two reactive groups. Compounds suitable for this purpose include, for example, the diaminosiloxanes described already above.

The components described above are preferably used in the resist in the following proportions:

Film-forming polymer: 1–50% by weight, preferably 2–10% by weight;
Photoacid generator: 0.01–10% by weight, preferably 0.1–1% by weight; and
Solvent: 80–99% by weight, preferably 88–97% by weight.

The components described can be used in the developer in the following proportions:

Amplifying agent: 0.1–10% by weight, preferably 2–3% by weight;
Swelling promoter: 0.01–10% by weight, preferably 0.5–2% by weight; and
Solvent: 50–99% by weight, preferably 92–97% by weight.

Other features which are considered as characteristic for the invention are set forth in the appended claims.

Although the invention is illustrated and described herein as embodied in a negative resist process with simultaneous development and silylation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The drawing FIGURE is a diagram showing the layer thickness of the photoresist that is grown, a function of the exposure dose, following simultaneous developing and silylation.

DESCRIPTION OF THE PREFERRED EMBODIMENTS

To prepare the resist, 10% by weight of a polymer which is a copolymer of tert-butyl methacrylate and allyltrimethylsilane with a maleic anhydride fraction of <10 mol % and 2.5% by weight of a photoacid generator are dissolved in methoxypropyl acetate. The resist is applied to a silicon wafer by spin coating so as to produce a thin film. The solvent is removed by heating at 80° C. on a hotplate. After cooling, the resist film is exposed at different doses and is then heated again in order to eliminate the acid-labile groups of the polymer in the exposed areas. For developing and amplifying, the resist layer is treated for 40 seconds with a silylating solution containing hexanol as a solvent and an aminosiloxane as a silylating agent. On developing with the silylating solution, a negative image is obtained in the form of what is known as a gray wedge, which is depicted in the drawing FIGURE. The unexposed portions have been detached from the substrate, while, in the exposed areas, the resist has been partially dissolved and has reacted with the aminosiloxane. The silylated layer is produced in equilibrium between the detachment and the crosslinking of the polymer.

The drawing FIGURE shows a plot in which the growth of the layer thickness is plotted against the exposure dose. Below a threshold dose, no acid is liberated from the photoacid generator, and so, in the contrasting step, no carboxyl groups are liberated which serve as anchor groups for the amplifying agent. With an increasing exposure dose, the number of anchor groups that are liberated in the polymer increases until a saturation level is reached at which all of the available anchor groups have been liberated. The aminosilane coordinates to the free anchor groups, where it brings about growth in the thickness of the resist layer.

We claim:
1. A process for producing amplified negative resist structures, which comprises:
providing a chemically amplified resist including:
a polymer including acid-labile groups, which by action of an acid, are eliminated and liberate anchor groups bringing about a change in a polarity of the polymer,
a photoacid generator, and
a solvent;
applying the chemically amplified resist to a substrate;
removing the solvent to provide a photosensitive resist film;
obtaining an exposed resist film by sectionally exposing the photosensitive resist film to liberate an acid from the photoacid generator in exposed sections of the photosensitive resist film;

contrasting the exposed resist film such that the acid-labile groups of the polymer are eliminated by the acid, which has been liberated, and the anchor groups are liberated in the exposed sections of the photosensitive resist film;

after the contrasting, developing the exposed resist film with a developer including:
- a solvent in which the polymer, when in a state including the acid-labile groups, is soluble and in which the polymer, when in a state after the anchor groups have been liberated, is substantially insoluble or swellable, and
- a silicon-containing amplifying agent including at least one reactive group that is able to coordinate to the anchor groups of the polymer; and removing excess developer.

2. The process according to claim 1, wherein: the developer includes a swelling promoter that swells the polymer when in the state after the anchor groups have been liberated.

3. The process according to claim 1, wherein: the solvent of the developer is apolar.

4. The process according to claim 1, wherein: the solvent of the developer has a low polarity.

5. The process according to claim 1, wherein: the polymer includes further reactive anchor groups that are able to form a bond with the reactive group of the amplifying agent.

6. The process according to claim 1, wherein: the amplifying agent includes at least two reactive groups.

7. The process according to claim 1, wherein: the reactive group of the amplifying agent is a basic group.

8. The process according to claim 1, wherein: the amplifying agent is an aminosiloxane.

* * * * *